(12) United States Patent
Baringer et al.

(10) Patent No.: US 9,912,348 B1
(45) Date of Patent: Mar. 6, 2018

(54) METHOD AND APPARATUS FOR HYBRID DELTA-SIGMA AND NYQUIST DATA CONVERTERS

(71) Applicant: GM GLOBAL TECHNOLOGY OPERATIONS LLC, Detroit, MI (US)

(72) Inventors: Cynthia D. Baringer, Piedmont, CA (US); Mohiuddin Ahmed, Moorpark, CA (US); Jongchan Kang, Moorpak, CA (US); Yen-Cheng Kuan, Los Angeles, CA (US); James Chingwei Li, Simi Valley, CA (US); Emilio A. Sovero, Thousands Oaks, CA (US); Timothy J. Talty, Beverly Hills, MI (US)

( * ) Notice: Subject to any disclaimer, the term of this patent is extended or adjusted under 35 U.S.C. 154(b) by 0 days.

(21) Appl. No.: 15/378,689

(22) Filed: Dec. 14, 2016

(51) Int. Cl.
*H04B 1/14* (2006.01)
*H03M 3/00* (2006.01)
*H04B 1/00* (2006.01)
*G05D 1/00* (2006.01)
*H04L 27/00* (2006.01)
*H04W 88/06* (2009.01)
*H04W 84/12* (2009.01)

(52) U.S. Cl.
CPC .......... *H03M 3/458* (2013.01); *G05D 1/0088* (2013.01); *H04B 1/0014* (2013.01); *H04B 1/0017* (2013.01); *H04B 1/0078* (2013.01); *H04L 27/0008* (2013.01); *H04W 84/12* (2013.01); *H04W 88/06* (2013.01)

(58) Field of Classification Search
CPC . H03M 3/458; G05D 1/0088; H04L 27/0008; H04B 1/0014; H04B 1/0017; H04B 1/0078; H04W 84/12; H04W 88/06
See application file for complete search history.

(56) References Cited

U.S. PATENT DOCUMENTS

| | | | |
|---|---|---|---|
| 6,373,418 B1 * | 4/2002 | Abbey ................ | H03M 7/3022 341/143 |
| 7,049,872 B2 * | 5/2006 | Diorio ....................... | G06F 1/10 327/234 |
| 7,242,337 B2 * | 7/2007 | Uemori ................. | H03M 3/372 329/306 |
| 9,065,472 B1 * | 6/2015 | McCue ................. | H03M 3/404 |
| 2006/0291671 A1 * | 12/2006 | Hyatt ................... | H04M 1/6008 381/110 |
| 2013/0083868 A1 * | 4/2013 | Onody ................... | H03M 3/392 375/316 |
| 2014/0266843 A1 * | 9/2014 | Pagnanelli ............ | H03M 3/468 341/155 |
| 2017/0041038 A1 * | 2/2017 | Kirkpatrick ............. | G01S 13/02 |

* cited by examiner

Primary Examiner — Siu Lee

(57) ABSTRACT

A wide bandwidth radio system designed to adapt to various global radio standards and, more particularly, to a radio receiver composed of a demodulator operative to work in a delta sigma mode and a Nyquist mode, and wherein a filter and feedback loop may utilized in response to the modulation mode of an RF signal.

19 Claims, 4 Drawing Sheets

METHOD AND APPARATUS FOR HYBRID DELTA-SIGMA AND NYQUIST DATA CONVERTERS

BACKGROUND

Field of the Technology

The present application generally relates to wide bandwidth radio system designed to adapt to various global radio standards and, more particularly, to a cellular radio architecture that employs a combination of a single circulator, programmable band-pass sampling radio frequency (RF) front-end and optimized digital baseband that is capable of supporting all current cellular wireless access protocol frequency bands. The system and method incorporate a compact receiver array design to support the demand for increased mobile broadband services by combining a traditional Nyquist and delta-sigma data converter to dynamically modify the data converter performance and behavior.

Discussion of the Related Art

Traditional cellular telephones employ different modes and bands of operation that have been supported in hardware by having multiple disparate radio front-end and baseband processing chips integrated into one platform, such as tri-band or quad-band user handsets supporting global system for mobile communications (GSM), general packet radio service (GPRS), etc. Known cellular receivers have integrated some of the antenna and baseband data paths, but nevertheless the current state of the art for mass mobile and vehicular radio deployment remains a multiple static channelizing approach. Such a static architecture is critically dependent on narrow-band filters, duplexers and standard-specific down-conversion to intermediate-frequency (IF) stages. The main disadvantage of this static, channelized approach is its inflexibility with regards to the changing standards and modes of operation. As the cellular communications industry has evolved from 2G, 3G, 4G and beyond, each new waveform and mode has required a redesign of the RF front-end of the receiver as well as expanding the baseband chip set capability, thus necessitating a new handset. For automotive applications, this inflexibility to support emerging uses is prohibitively expensive and a nuisance to the end-user.

Providing reliable automotive wireless access is challenging from an automobile manufacturers point of view because cellular connectivity methods and architectures vary across the globe. Further, the standards and technologies are ever changing and typically have an evolution cycle that is several times faster than the average service life of a vehicle. More particularly, current RF front-end architectures for vehicle radios are designed for specific RF frequency bands. Dedicated hardware tuned at the proper frequency needs to be installed on the radio platform for the particular frequency band that the radio is intended to operate at. Thus, if cellular providers change their particular frequency band, the particular vehicle that the previous band was tuned for, which may have a life of 15 to 20 years, may not operate efficiently at the new band. Hence, this requires automobile manufactures to maintain a myriad of radio platforms, components and suppliers to support each deployed standard, and to provide a path to upgradability as the cellular landscape changes, which is an expensive and complex proposition.

Known software-defined radio architectures have typically focused on seamless baseband operations to support multiple waveforms and have assumed similar down-conversion-to-baseband specifications. Similarly, for the transmitter side, parallel power amplifier chains for different frequency bands have typically been used for supporting different waveform standards. Thus, receiver front-end architectures have typically been straight forward direct sampling or one-stage mixing methods with modest performance specifications. In particular, no prior application has required a greater than 110 dB dynamic range with associated IP3 factor and power handling requirements precisely because such performance needs have not been realizable with complementary metal oxide semiconductor (CMOS) analog technologies. It has not been obvious how to achieve these metrics using existing architectures for CMOS devices, thus the dynamic range, sensitivity and multi-mode interleaving for both the multi-bit analog-to-digital converter (ADC) and the digital-to-analog converter (DAC) is a substantially more difficult problem.

Delta-sigma modulators are becoming more prevalent in digital receivers because, in addition to providing wideband high dynamic range operation, the modulators have many tunable parameters making them a good candidate for reconfigurable systems. In particular, delta-sigma modulators include a software tunable filter for noise shaping an incoming RF signal. It would be desirable to allow a software controlled radio system to trade-off its RF bandwidth versus dynamic range as the signal environment requires and be less constrained by initial electronic hardware choices.

SUMMARY OF THE INVENTION

The present disclosure describes an apparatus comprising a first signal path having a bandpass filter for filtering an RF signal, a second signal path, an analog to digital converter operative in a first mode and a second mode, an input for receiving the RF signal, and a switch network for coupling the RF signal to the analog to digital converter over one of the first signal path and the second signal path in response to a modulation format of the RF signal.

Another aspect of the present disclosure describes an integrated circuit an input for receiving an RF signal, an analog to digital converter for generating a digital signal, wherein the analog to digital converter operates in one of a first mode of operation and a second mode of operation, a filter for filtering the RF signal in response to the analog to digital converter operating in the first mode of operation, and a filter bypass for bypassing the filter in response to the analog to digital converter operating in the second mode of operation.

Another aspect of the present disclosure describes a method comprising receiving an RF signal and converting that RF signal to a digital signal having one of a Nyquist Analog-to-Digital Converter (ADC) and a delta sigma ADC format, determining a conversion method of the RF signal, filtering the RF signal in response to the conversion method being the Nyquist ADC, demodulating the RF signal according to the Nyquist ADC in response to in response to the conversion method being the Nyquist ADC, and converting the RF signal to generate a digital signal according to the delta sigma ADC in response to in response to the conversion method being the delta sigma ADC.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a cellular radio architecture is merely exemplary in nature, and is in no way intended to limit the invention or its applications or uses. For example, the radio architecture of the invention is described as having application for a vehicle. However, as will be appreciated by those skilled in the art, the radio architecture may have applications other than automotive applications.

The cellular radio architectures discussed herein are applicable to more than cellular wireless technologies, for example, WiFi (IEEE 802.11) technologies. Further, the cellular radio architectures are presented as a fully duplexed wireless system, i.e., one that both transmits and receives. For wireless services that are receive only, such as global positioning system (GPS), global navigation satellite system (GNSS) and various entertainment radios, such as AM/FM, digital audio broadcasting (DAB), SiriusXM, etc., only the receiver design discussed herein would be required. Also, the described radio architecture design will enable one radio hardware design to function globally, accommodating various global wireless standards through software updates. It will also enable longer useful lifespan of the radio hardware design by enabling the radio to adapt to new wireless standards when they are deployed in the market. For example, 4G radio technology developments and frequency assignments are very dynamic. Thus, radio hardware deployed in the market may become obsolete after just one or two years. For applications, such as in the automotive domain, the lifespan can exceed ten years. This invention enables a fixed hardware platform to be updateable through software updates, thus extending the useful lifespan and global reuse of the hardware.

Figure 1:
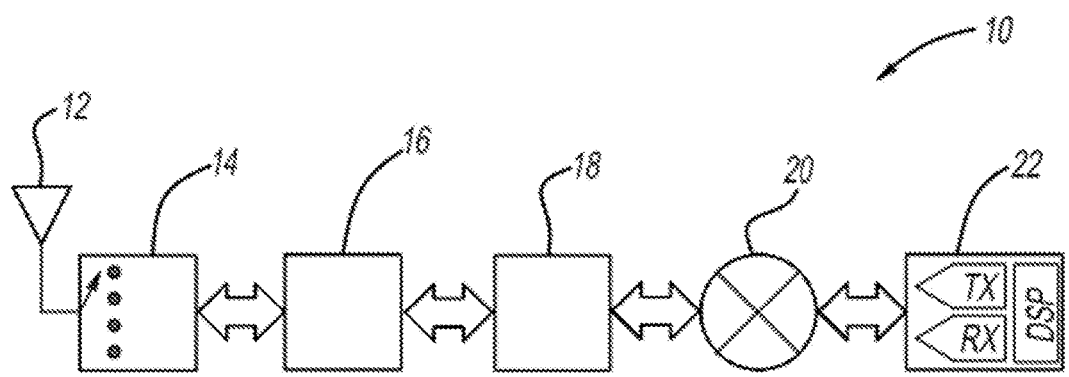
FIG. 1 shows a block diagram of a known multi-mode, multi-band cellular communications handset architecture.

FIG. 1 is a block diagram of a known multi-mode, multi-band cellular communications user handset architecture 10 for a typical cellular telephone. The architecture 10 includes an antenna structure 12 that receives and transmits RF signals at the frequency band of interest. The architecture 10 also includes a switch 14 at the very front-end of the architecture 10 that selects which particular channel the transmitted or received signal is currently for and directs the signal through a dedicated set of filters and duplexers represented by box 16 for the particular channel. Modules 18 provide multi-mode and multi-band analog modulation and demodulation of the receive and transmit signals and separates the signals into in-phase and quadrature-phase signals sent to or received from a transceiver 20. The transceiver 20 also converts analog receive signals to digital signals and digital transmit signals to analog signals. A baseband digital signal processor 22 provides the digital processing for the transmit or receive signals for the particular application.

Figure 2:
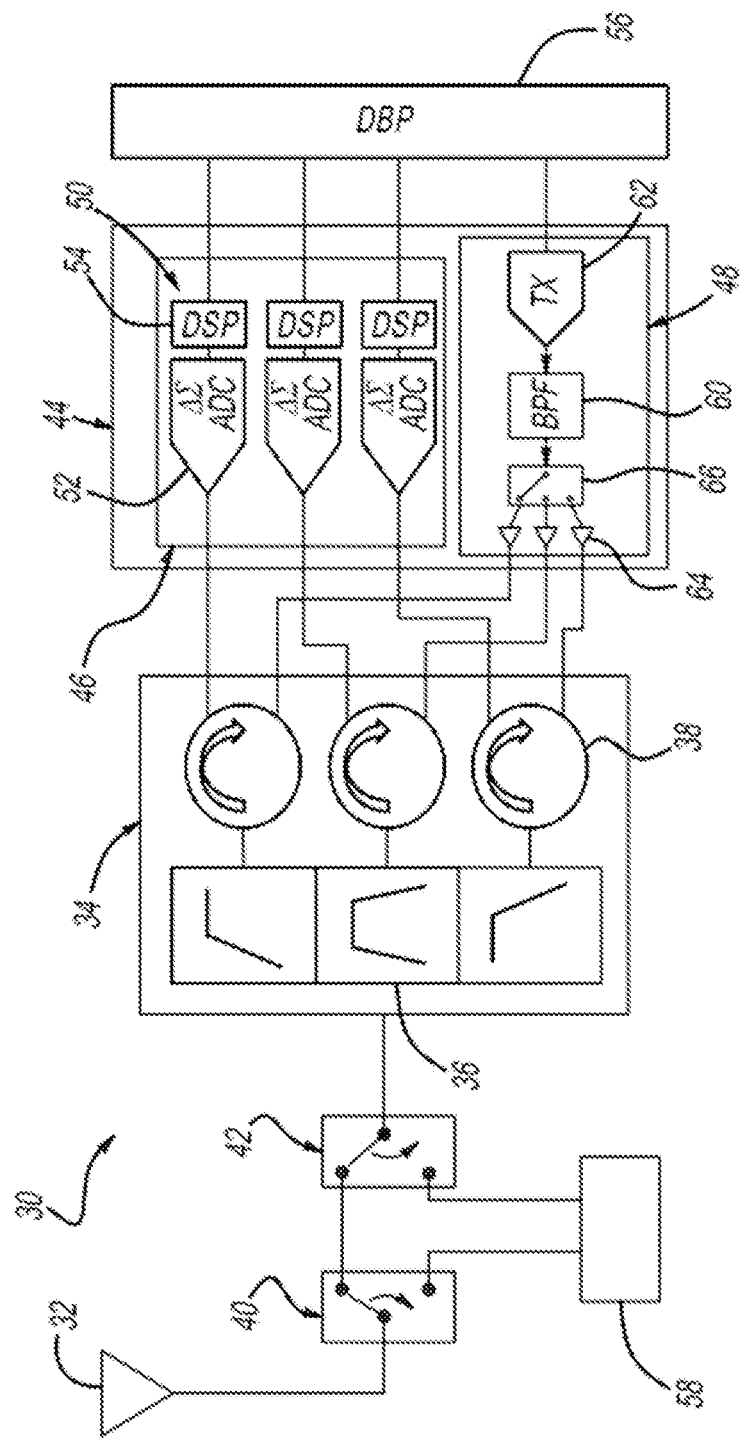
FIG. 2 shows a block diagram of a software-programmable cellular radio architecture applicable.

FIG. 2 is a schematic block diagram of a cellular radio front-end architecture 30 that provides software programmable capabilities as will be discussed in detail below. The architecture 30 includes an antenna structure 32 capable of receiving and transmitting the cellular frequency signals discussed herein, such as in a range of 400 MHz-3.6 GHz. Signals received and transmitted by the antenna structure 32 go through a multiplexer 34 that includes three signal paths, where each path is designed for a particular frequency band as determined by a frequency selective filter 36 in each path. In this embodiment, three signal paths have been selected, however, the architecture 30 could be expanded to any number of signal paths. Each signal path includes a circulator 38 that separates and directs the receive and transmit signals, and provides isolation so that the high power signals being transmitted do not enter the receiver side and saturate the receive signals at those frequency bands.

The architecture 30 also includes a front-end transceiver module 44 that is behind the multiplexer 34 and includes a receiver module 46 that processes the receive signals and a transmitter module 48 that processes the transmit signals. The receiver module 46 includes three receiver channels 50, one for each of the signal paths through the multiplexer 34, where a different one of the receiver channels 50 is connected to a different one of the circulators 38, as shown. Each of the receiver channels 50 includes a delta-sigma modulator 52 that receives the analog signal at the particular frequency band and generates a representative stream of digital data using an interleaving process in connection with a number of N-bit quantizer circuits operating at a very high clock rate, as will be discussed in detail below. As will further be discussed, the delta-sigma modulator 52 compares the difference between the receive signal and a feedback signal to generate an error signal that is representative of the digital data being received. The digital data bits are provided to a digital signal processor (DSP) 54 that extracts the digital data stream. A digital baseband processor (DBP) 56 receives and operates on the digital data stream for further signal processing in a manner well understood by those skilled in the art. The transmitter module 48 receives digital data to be transmitted from the processor 56. The module 48 includes a transmitter circuit 62 having a delta-sigma modulator that converts the digital data from the digital baseband processor 56 to an analog signal. The analog signal is filtered by a tunable bandpass filter (BPF) 60 to remove out of band emissions and sent to a switch 66 that directs the signal to a selected power amplifier 64 optimized for the transmitted signal frequency band. In this embodiment, three signal paths have been selected, however, the transmitter module 48 could be implemented using any number of signal paths. The amplified signal is sent to the particular circulator 38 in the multiplexer 34 depending on which frequency is being transmitted.

As will become apparent from the discussion below, the configuration of the architecture 30 provides software programmable capabilities through high performance delta-sigma modulators that provide optimized performance in the signal band of interest and that can be tuned across a broad range of carrier frequencies. The architecture 30 meets current cellular wireless access protocols across the 0.4-2.6 GHz frequency range by dividing the frequency range into three non-continuous bands. However, it is noted that other combinations of signal paths and bandwidth are of course possible. The multiplexer 34 implements frequency domain de-multiplexing by passing the RF carrier received at the antenna structure 32 into one of the three signal paths. Conversely, the transmit signal is multiplexed through the multiplexer 34 onto the antenna structure 32. For vehicular wireless access applications, such a low-cost integrated device is desirable to reduce parts cost, complexity, obsolescence and enable seamless deployment across the globe.

The delta-sigma modulators 52 may be positioned near the antenna structure 32 so as to directly convert the RF receive signals to bits in the receiver module 46 and bits to an RF signal in the transmitter module 48. The main benefit of using the delta-sigma modulators 52 in the receiver channels 50 is to allow a variable signal capture bandwidth and variable center frequency. This is possible because the architecture 30 enables software manipulation of the modulator filter coefficients to vary the signal bandwidth and tune the filter characteristics across the RF band, as will be discussed below.

The architecture 30 allows the ability to vary signal capture bandwidth, which can be exploited to enable the reception of continuous carrier aggregated waveforms without the need for additional hardware. Carrier aggregation is a technique by which the data bandwidths associated with multiple carriers for normally independent channels are combined for a single user to provide much greater data rates than a single carrier. Together with MIMO, this feature is a requirement in modern 4G standards and is enabled by the orthogonal frequency division multiplexing (OFDM) family of waveforms that allow efficient spectral usage.

The architecture 30 through the delta-sigma modulators 52 can handle the situation for precise carrier aggregation scenarios and band combinations through software tuning of the bandpass bandwidth, and thus enables a multi-segment capture capability. Dynamic range decreases for wider bandwidths where more noise is admitted into the sampling bandpass. However, it is assumed that the carrier aggregation typically makes sense when the user has a good signal-to-noise ratio, and not cell boundary edges when connectivity itself may be marginal. Note that the inter-band carrier aggregation is automatically handled by the architecture 30 since the multiplexer 34 feeds independent modulators in the channels 50.

The circulators 38 route the transmit signals from the transmitter module 48 to the antenna structure 32 and also provide isolation between the high power transmit signals and the receiver module 46. Although the circulators 38 provide significant signal isolation, there is some port-to-port leakage within the circulator 38 that provides a signal path between the transmitter module 48 and the receiver module 46. A second undesired signal path occurs due to reflections from the antenna structure 32, and possible other components in the transceiver. As a result, a portion of the transmit signal will be reflected from the antenna structure 32 due to a mismatch between the transmission line impedance and the antenna's input impedance. This reflected energy follows the same signal path as the incoming desired signal back to the receiver module 46.

The architecture 30 is also flexible to accommodate other wireless communications protocols. For example, a pair of switches 40 and 42 can be provided that are controlled by the DBP 56 to direct the receive and transmit signals through dedicated fixed RF devices 58, such as a global system for mobile communications (GSM) RF front-end module or a WiFi front-end module. In this embodiment, some select signal paths are implemented via conventional RF devices. FIG. 2 only shows one additional signal path, however, this concept can be expanded to any number of additional signal paths depending on use cases and services.

Delta-sigma modulators are a well-known class of devices for implementing analog-to-digital conversion over a wide RF bandwidth. The fundamental properties that are exploited are oversampling and error feedback (delta) that is accumulated (sigma) to convert the desired signal into a pulse modulated stream that can subsequently be filtered to read off the digital values, while effectively reducing the noise via shaping. A limitation of known delta-sigma modulators is the quantization noise in the pulse conversion process which limits the dynamic range of the receiver. It would be desirable to allow a software controlled radio system to trade-off its RF bandwidth versus dynamic range as the signal environment requires and be less constrained by initial electronic hardware choices.

The proposed software controlled radio works to achieve the desired result by adjusting the capabilities of the receiver between narrow-band communications standards (<10 MHz instantaneous bandwidth) and wide-band communication standards (>10 MHz instantaneous bandwidth). Given the low allowed transit power and high receiver sensitivity requirements of most civil communications standards, a low noise floor may be required to achieve the necessary dynamic range for spectrally dense, high order signal modulation (QAM64 and higher) at low symbol rate (<1 MSPS) which favors a delta-sigma type data converter. However, given the large amount of spectrum available, it may be advantageous to the system to run simpler signal modulation (OOK) over a higher symbol rate (>500 MSPS) favoring a Nyquist data converter. Since the nature of civil communications standards (802.11a/b/g/n) is to select the best channel, bandwidth, and signal modulation to provide the highest data rate and quality of service in a particular physical locale at a particular time, it would advantageous for the radio to have the capability to select between Nyquist and delta-sigma data converter modes. In the past, a radio manufacturer would normally choose one type of data converter or the other. It is possible for a radio to incorporate two separate data converter types, but this leads to a larger radio physical format and additional electronics hardware (switches, power dividers) that would significantly degrade the radio's performance.

Figure 3:
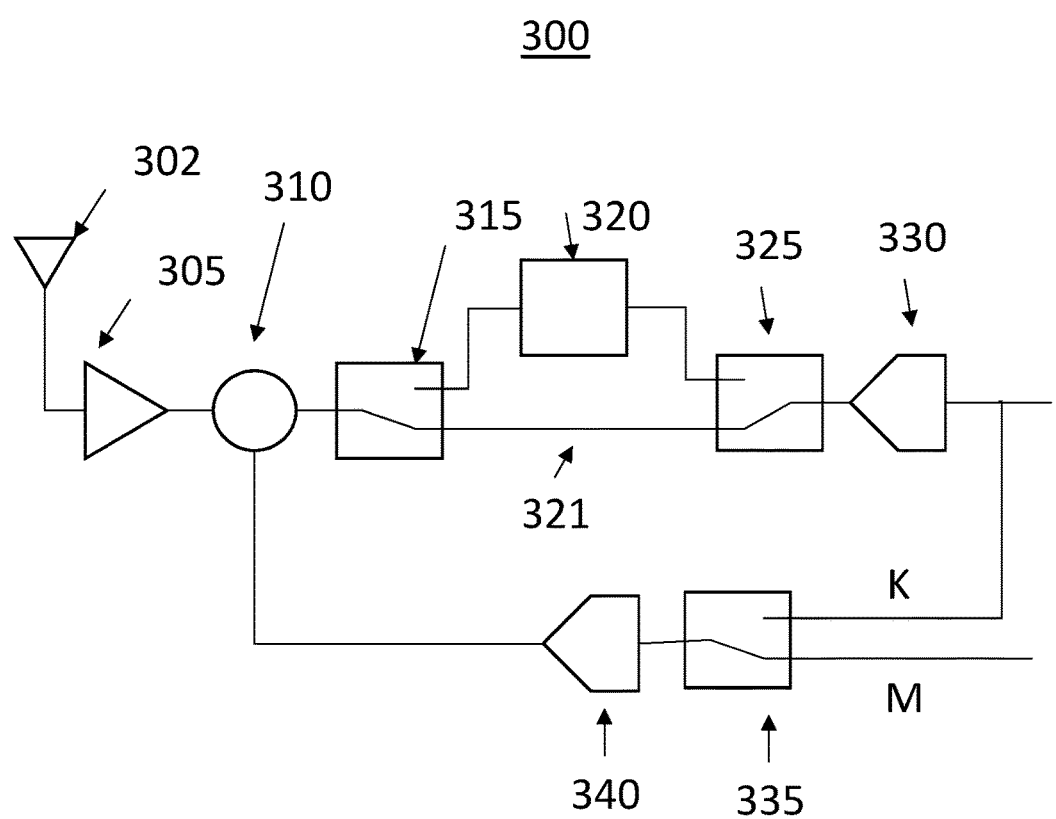
FIG. 3 shows an exemplary software controlled radio with delta sigma ADC and Nyquist ADC.

Turning now to FIG. 3, an exemplary software controlled radio 300 with delta signal ADC and Nyquist ADC is shown. The software controlled radio is operative to receive an RF signal via an antenna 302 or other RF input. The received RF signal is amplified by a low noise transconductance amplifier (LNTA) 305. A first switch 315 is used to optionally couple the amplified RF signal between a summing node 310 and Nth order filter 320. Optionally, a second switch 325 may be used to couple the filtered signal between the Nth order filter 320 and Mth bit Nyquist ADC 330. The second switch 325 may be embedded into the Nyquist ADC 330. The summing node 310 may be located between the LNTA 310 as shown, or alternatively, may be located between the first switch 315 and the second switch 325 along a filter bypass 321

The Nyquist ADC 330 is used to digitize the filtered RF signal to generate a digital signal. An original analog signal can be reconstructed from a digital signal provided that the baseband signal has a bandwidth less than the Nyquist frequency. The Nyquist frequency is the minimum rate at which a signal can be sampled without introducing errors, which is twice the highest frequency present in the signal. The first switch 315 and the second switch 325 are operated in response to the format of the RF signal being received and/or the bandwidth of the RF signal being received. If the data carried by the RF signal has been digitized using the Nyquist frequency, the RF signal will have a narrower bandwidth. The switches will then be configured to route the RF signal through the Nth order filter 320 and then to the ADC operating in the Nyquist mode. In an exemplary embodiment, the output of the Nyquist ADC will be a large number of bits for the Nyquist operation, such as 8-12 bits.

If the data carried by the RF signal has been formatted using a delta sigma modulator, the RF signal will have a wider bandwidth and therefore the Nth order filter 320 will be bypassed and the first switch 315 and the second switch 325 will be configured to couple the signal through the second signal path, bypassing the Nth order filter 320. The ADC 330 will then be configured to operate in the delta sigma mode. In another exemplary embodiment, the ADC 330 operating in the delta sigma mode will output a small number of bits for the delta sigma operation, such as 1-3 bits.

A third switch 335 may then be used to couple the digital signal to a digital-to-analog converter (DAC) 340. The third switch 335 is operative to couple the output (K) of the ADC 330 operating in the delta sigma mode to the DAC 340 to generate an analog signal to be used in the feedback operation of the sigma delta modulator. The DAC 340 is used to convert the digitized signal to an analog signal for combining with the amplified RF signal. The third switch 335 may be embedded into the DAC 340 and be configured to choose which K bits from the Nyquist ADC 330 to use as digital data input. The additional M bits feeding into the DAC 340 through the third switch 335 may or may not be present, but provides a means to perform digital correction in Nyquist mode. If present, the third switch 335 may be used to couple M bits to the DAC 340 for offset calibration in the Nyquist mode.

On the transmitter side, an exemplary Sigma-Delta DAC to be used may be composed of a traditional multi-bit DAC of any architecture, but likely current steering type for higher sample rates, and associated digital data control. The digital data control would generate a multi-bit wide word corresponding to the multi-bit DAC resolution. These digital words could be of a conventional Nyquist waveform or a Sigma-Delta modulated waveform. Advantageously, using the hardware of the above exemplary embodiment, switching between these two waveforms may be performed through software without reconfiguration of the hardware.

On the receiver, the exemplary software configurable radio is implemented with a Delta-Sigma modulator where the ADC is more than 1 bit and the filter/resonator can be bypassed by one or more switches. The exemplary system may include a receiver, or software controlled radio composed of a Delta-Sigma modulator where the ADC is more than 1 bit and the filter/resonator can be bypassed by one or more switches. The system may further include a switch to select the DAC data inputs from the ADC or external input. Complimentary to the system may be a transmitter composed of a DAC and digital control logic where the digital data input to the DAC can be altered between a conventional Nyquist signal and a Sigma-Delta modulated signal.

The system and method may be operational to receive an RF signal and converting that signal to a digital signal where a sigma delta modulator is implemented use a M-bit ADC where the M-bit digital code output is also feedback via a switch to a M-bit Digital-to-Analog (DAC), thus creating an analog signal that is fed into a summing node of the RF signal thus implementing a sigma delta modulator that is use as a sigma delta ADC.

Figure 4:
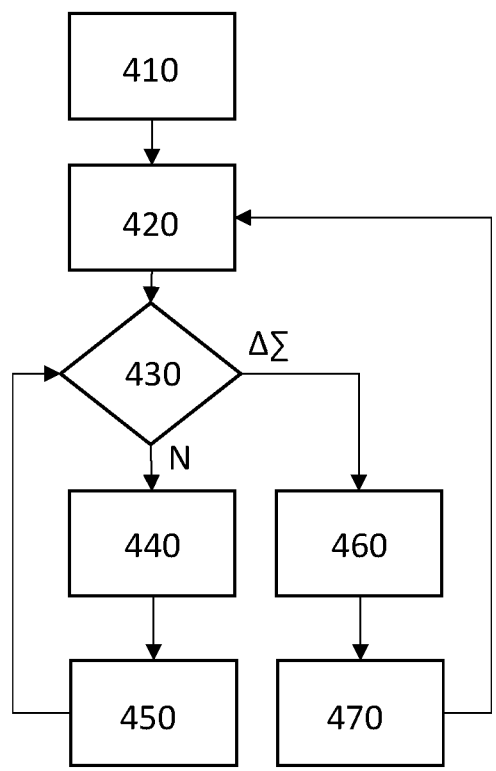
FIG. 4 shows an exemplary method demodulating an RF using a hybrid delta-sigma and Nyquist data conversion configuration.

Turning now to FIG. 4, an exemplary method for demodulating an RF using a hybrid delta-sigma and Nyquist data configuration 400 is shown. The method is first operative to receive an RF signal 410.

After the signal is received 410, the method is operative to condition the signal in a manner that is advantageous to both the Nyquist data configuration and the delta sigma configuration 420. This may include amplification using a low noise amplifier and/or filtering at the widest bandwidth.

Once the RF signal is initially conditions, the method is then operative to determine the digital format, which may be the modulation format of the data carried by the RF signal 430. This determination may be done by initially demodulating the data using the delta sigma mode or the Nyquist mode and analyzing the results. Alternatively, an indicator may be transmitted by the transmitter to indicate the modulation mode, such as a configuration signal sent in the most robust modulation mode, or an indicator may be placed in a header of the data to indicate the modulation mode.

Once the modulation mode is determined 430, a switch network is configured in response to the modulation mode. For example, if the data is modulated in the Nyquist mode, the RF signal is filtered using a narrow bandwidth filter and the feedback path used for the delta sigma operation is uncoupled 440. Alternatively, if the signal is modulated in the delta sigma mode, the filter is bypassed and the feedback loop is coupled to the ADC for the delta sigma operation 460.

If the Nyquist modulation mode is used and after the switch network is configured accordingly 440, the method is then operative to convert the RF signal to a digital signal according to the Nyquist mode 450. Periodically, the method is operative to determine the modulation mode of the incoming signal 430. This redetermination may be made in response to a timer, a packet count, or an error signal, etc.

If the delta sigma modulation mode is used and after the switch network is configured accordingly 460, the method is then operative to convert the RF signal to a digital signal according to the delta sigma mode 470. Periodically, the method is operative to determine the modulation mode of the incoming signal 430. This redetermination may be made in response to a timer, a packet count, or an error signal, etc.

As will be well understood by those skilled in the art, the several and various steps and processes discussed herein to describe the invention may be referring to operations performed by a computer, a processor or other electronic calculating device that manipulate and/or transform data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An apparatus comprising:
    a first signal path having a bandpass filter for filtering an RF signal;
    a second signal path;
    an analog to digital converter operative in a first mode and a second mode, wherein the first mode is a Nyquist mode and the second mode is a delta sigma mode;
    an input for receiving the RF signal; and a switch network for coupling the RF signal to the analog to digital converter over one of the first signal path and the second signal path in response to a modulation format of the RF signal.

2. The apparatus of claim 1 wherein the switch network is configured to couple the RF signal via the first signal path in response to the modulation format being a Nyquist modulation format.

3. The apparatus of claim 2 wherein the input is coupled to an antenna for receiving the RF signal.

4. The apparatus of claim 1 wherein the switch network is configured to couple the RF signal via the second signal path in response to the modulation format being a delta sigma modulation format.

5. The apparatus of claim 1 further comprising a feedback path wherein the feedback path is coupled to an output of the analog to digital converter in response to the modulation format being a delta sigma modulation format.

6. The apparatus of claim 5 wherein the feedback path includes a digital to analog converter.

7. An integrated circuit comprising:
an input for receiving an RF signal;
an analog to digital converter for generating a digital signal, wherein the analog to digital converter operates in one of a first mode of operation and a second mode of operation;
a filter for filtering the RF signal in response to the analog to digital converter operating in the first mode of operation; and
a filter bypass for bypassing the filter in response to the analog to digital converter operating in the second mode of operation.

8. The integrated circuit of claim 7 further comprising:
a summing node for combining the RF signal and an analog signal to generate a combined signal, wherein the analog to digital converter is operative to generate the digital signal in response to the combined signal; and
a digital to analog converter for generating the analog signal in response to the digital signal.

9. The integrated circuit of claim 8 wherein the digital to analog converter is decoupled from the analog to digital converter in response to the analog to digital converter operating in the first mode of operation.

10. The integrated circuit of claim 7 wherein the first mode of operation is a Nyquist mode and the second mode of operation is a delta sigma mode.

11. The integrated circuit of claim 7 wherein the input is coupled to an antenna.

12. A method comprising:
receiving an RF signal having one of a Nyquist digital format and a delta sigma digital format;
determining a digital format of the RF signal;
filtering the RF signal in response to the digital format being the Nyquist digital format;
converting the RF signal according to the Nyquist digital format to generate a Nyquist digital signal in response to the digital format being the Nyquist digital format; and
converting the RF signal to generate a delta sigma digital signal according to the delta sigma digital format in response to the digital format being the delta sigma digital format.

13. The method of claim 12 further comprising:
generating an analog signal in response to the delta sigma digital signal;
coupling the analog signal to the RF signal to generate a combined signal; and
converting the combined signal according to a delta sigma modulation to generate a combined digital signal.

14. The method of claim 13 wherein the combined digital signal is a control signal for controlling an autonomous vehicle.

15. The method of claim 12 further comprising filtering and amplifying the RF signal prior to determining the digital format of the RF signal.

16. The method of claim 12 wherein the digital format of the RF signal is determined in response to converting the RF signal according to the delta signal digital format.

17. The method of claim 12 wherein the digital format of the RF signal is determined in response to converting the RF signal according to the Nyquist digital format.

18. The method of claim 12 wherein the digital format of the RF signal is determined in response to information contained in a packet header carried by the RF signal.

19. The method of claim 12 wherein the digital format of the RF signal is determined in response to a data signal transmitted prior to the RF signal.

* * * * *